United States Patent [19]

Grace

[11] Patent Number: 5,357,191

[45] Date of Patent: Oct. 18, 1994

[54] METHOD AND APPARATUS FOR TESTING CIRCUIT BOARDS

[75] Inventor: James R. Grace, Cromwell, Conn.

[73] Assignee: Probot, Inc., Branford, Conn.

[21] Appl. No.: 973,185

[22] Filed: Nov. 9, 1992

[51] Int. Cl.[5] ............................................. G01R 31/02
[52] U.S. Cl. .................................. 324/754; 324/678; 324/158.1
[58] Field of Search ................ 324/158 F, 158 P, 725, 324/537, 678, 568; 439/482

[56] References Cited

U.S. PATENT DOCUMENTS

| | | | |
|---|---|---|---|
| 4,565,966 | 1/1986 | Burr et al. | 324/158 F |
| 5,006,808 | 4/1991 | Watts | 324/158 F |
| 5,023,545 | 6/1991 | Marques | 324/158 P |
| 5,124,647 | 6/1992 | Watts | 324/158 P |
| 5,138,266 | 8/1992 | Stearns | 324/158 R |
| 5,140,272 | 8/1992 | Nishimatsu et al. | 324/158 R |

*Primary Examiner*—Vinh Nguyen
*Attorney, Agent, or Firm*—Robert H. Montgomery

[57] ABSTRACT

The disclosure shows the use of a plurality of individually moveable probes in an X-Y plane which may contact points of networks on a circuit board on either side thereof and measure the discharge time of a charged network. The specification also discloses the utilization of a common connector to a conductive reference plane to provide a terminal point for any of the plurality of probes. Each probe is a dual-purpose probe in that it may be utilized for a discharge test of each network, or it may be used in a combination with another probe to measure the resistance of a network. In most instances, the circuit board under test will include a common conductive reference plane which may be utilized as one side of a test source. Each network is tested as to discharge time against a norm which is previously determined; if the discharge time is too long above the norm, such long discharge time will indicate a possible fault. If the discharge time is too short the short discharge time will indicate a possible fault in the network. The probes may be switched from the discharge circuits to a mode in which two probes are connected to a power source and resistance measuring circuit to measure the resistance of a network or parts thereof to check for continuity or to measure the resistance between two networks to check for a short between two networks.

20 Claims, 3 Drawing Sheets

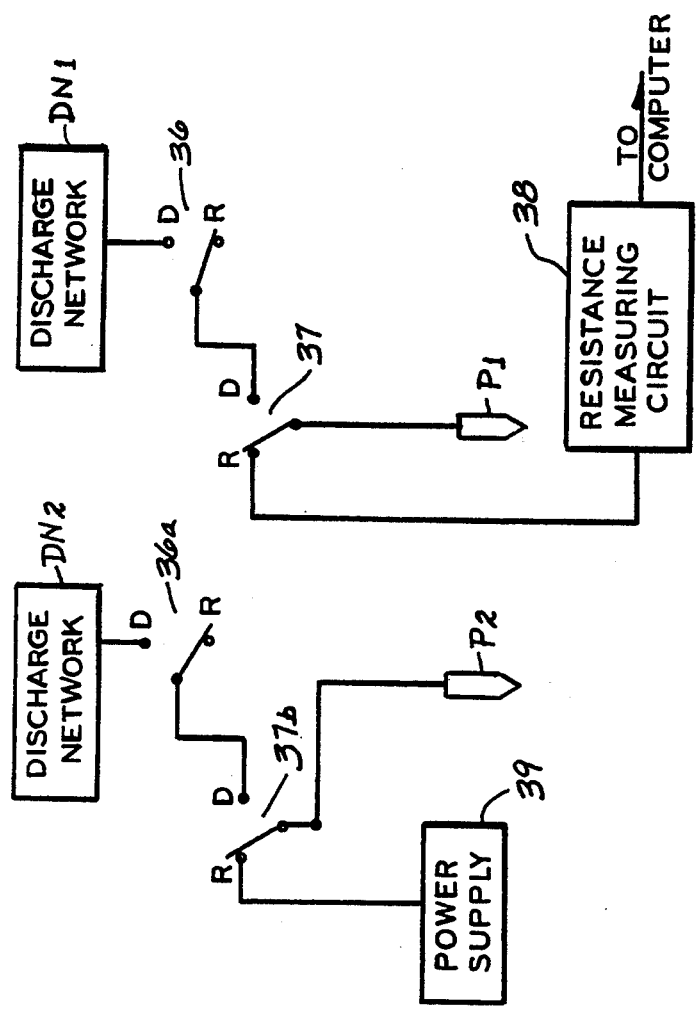
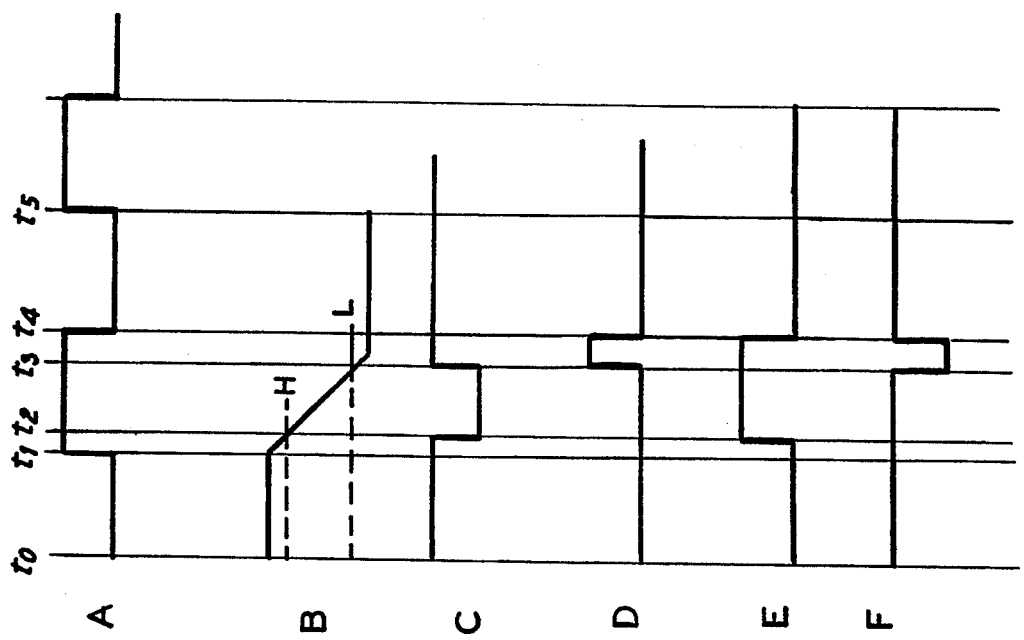

METHOD AND APPARATUS FOR TESTING CIRCUIT BOARDS

FIELD OF THE INVENTION

This invention relates to the testing of what may be termed electrical interconnection networks, but are more commonly referred to as circuit boards, to determine the integrity or validity of various runs of circuits on various layers of a board or multi-layered board, commonly referred to as networks or "nets," and to determine that these networks are not shorted to each other or open-circuited during a circuit run of a network.

BACKGROUND OF THE INVENTION

Circuit boards are used for mounting and interconnecting electronic components in most electronic equipment. Such circuit boards are made after design thereof, wherein an image of the desired board or circuit networks are made by a plating or etching process, or a combination of such processes providing various conductive paths.

Various boards may be laminated together and the networks on each board connected to one of the other laminated boards.

Such boards may be very expensive depending on the size thereof, the number of networks, and the number of boards which may be laminated together. More important is the overall integrity of the board when it is utilized in a much more expensive piece of equipment. Such boards are subject to one or more defects including discontinuities in a network, resulting in an open circuit and a resistive fault, or where two or more networks are shorted together.

There have been many different tests utilized on pre-prepared circuit boards, which may be referred to as "raw boards," before electrical components are mounted thereon.

One such testing device which is known in the art is the so-called "bed of nails" in which probes contact each network and, under the control of a computer program, make resistance measurements between each terminal pair of a network of the board to verify the existence of a proper conductive path to ensure that there are no short circuits or unacceptable low resistance paths between networks. This "bed of nails" testing technique is effective where there are a large number of boards to be tested, justifying the customization and positioning of the probes.

Also, techniques have been suggested utilizing moveable probes for measuring the continuity between circuit board networks, and possible shorting between between networks or portions thereof.

It has also been suggested that moving probes be used to test each network to determine whether the conductor patterns or networks meet specifications, as described in an article entitled "Computerized Testing of Thin-Film Circuit Conductors" by Alan R. Gerhardt et al. of Western Electric Corporation (in *Solid State Technology*, September, 1971.)

Another method of testing the integrity of networks on a circuit board is described in U.S. Pat. 3,975,680 in which the capacitance of each circuit board network with respect to a common ground plane is made. A further procedure for such capacitance testing is described in an article by Robert W. Wedwick, in Testing MLBs *Continuity by Capacitance*, November, 1974, pp. 60–61.

U.S. Pat. No. 4,565,966 describes a method and apparatus for testing circuit boards, utilizing a combination of capacitance and resistance testing, which embodies an obvious combination of prior art techniques of capacitance testing and resistance testing.

The present invention is directed to a method and apparatus for testing circuit boards, wherein probes contacting terminal points on the board will first charge the network and then measure the discharge time between a network on a board and a conductive reference plane. If the discharge time is without certain time restraints, then resistance checks are made to determine continuity.

The initial checks on each network are not really a measure of capacitance of the network with respect to a reference conductor, but a measure of the time in which a charged network will discharge with respect to a conductive reference plane after being charged to a predetermined voltage.

An object of this invention is to provide a new and improved method and apparatus for testing bare circuit boards.

Another object of this invention is to provide a new and improved method and apparatus for testing the integrity of networks on a circuit board where each network is charged to a predetermined voltage with respect to a conductive reference plane and the discharge time is measured to determine the integrity of the network.

A further object of the invention is to provide a new and improved moving probe arrangement for measuring the discharge time of charged networks and also for measuring the resistance of a network or portions of a network, which do not conform to the discharge testing.

SUMMARY OF THE INVENTION

Briefly stated, the invention in one form thereof comprises the use of a plurality of individually moveable probes in an X-Y plane which may contact points of networks on the board on either side thereof. The apparatus and method embodying the invention also may utilize a common connector to a conductive reference plane to provide a terminal point for any of the plurality of probes.

Each probe is a dual-purpose probe in that it may be utilized for a discharge test of each network, or it may be used in a combination with another probe to measure the resistance of a network.

In most instances, the circuit board under test will include a common conductive reference plane which may be utilized as one side of a test source.

Each network is tested as to discharge time against a norm which is previously determined; if the discharge time is too long above the norm, such long discharge time will indicate a short circuit. If the discharge time is too short such short discharge time may indicate a discontinuity in the network.

The probes may be switched from the discharge circuits to a mode in which two probes are connected to a voltage source and a resistance measuring circuit to measure the resistance of a network to check for continuity or to measure the resistance between two networks to check for a short between two networks.

The features of the invention which are believed to be novel are particularly pointed and distinctly claimed in the concluding portion of this specification. The invention, however, together with further objects and advantages thereof may best be appreciated by references to the following detailed description taken in conjunction with the drawings.

BRIEF DESCRIPTION OF THE DRAWINGS

FIG. 4 is a timing diagram showing various waveforms A–F on a time occurrence basis; and FIG. 5 is a diagram partially schematic and partially in block form showing a portion of FIG. 3 when two of the probes of FIG. 3 are in a resistance measuring mode.

DETAILED DESCRIPTION OF PREFERRED EMBODIMENTS OF THE INVENTION

Figure 1:
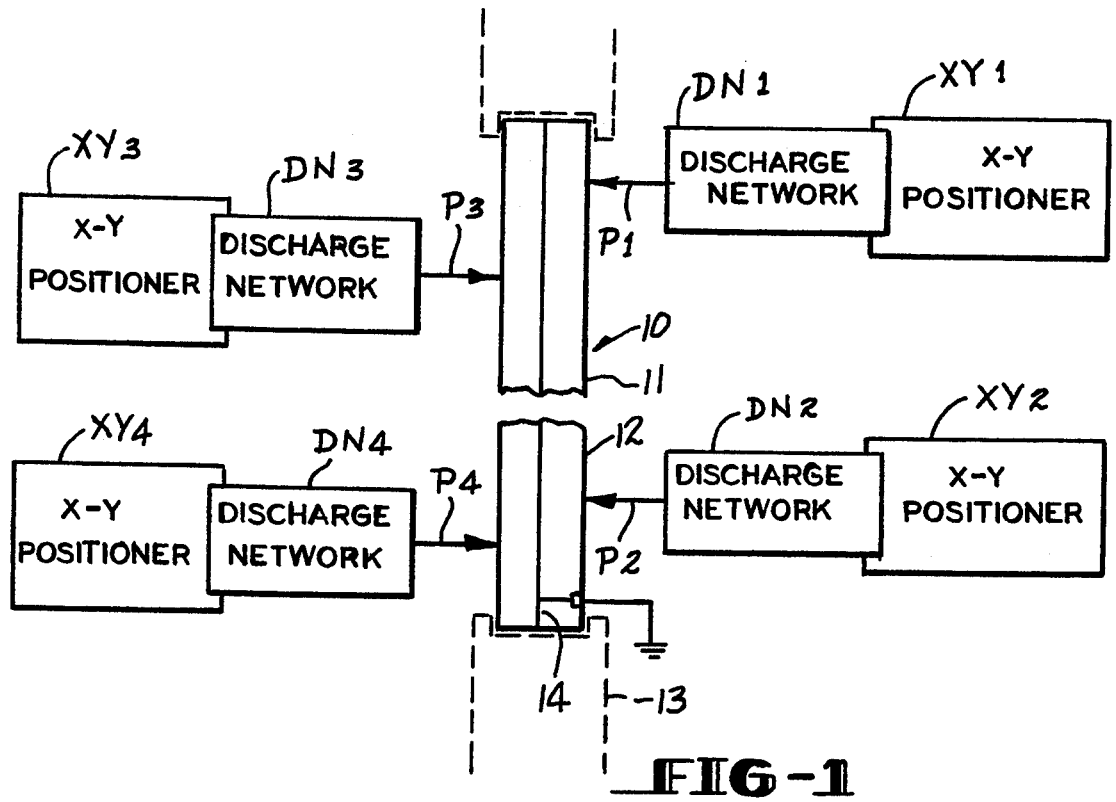
FIG. 1 is a representative end elevation of a circuit board under test by four probes.

Referring now to FIG. 1, there is exemplified a circuit board 10 which for descriptive purposes includes two laminated boards 11 and 12 which may have circuit networks on either side thereof and which circuits of each segment of the board may be connected to other segments of the board when active components are mounted thereto. The board 10 is shown as being held in a fixture 13, shown in dotted line. In some instances, if the circuit board does not have an internal conduction reference plane, one (not shown) may be provided on one side of the board as shown in U.S. Pat. No. 4,565,966.

On either side of the board are a pair of probes indicated as probes P1–P4 which are each driven by an X-Y positioner also identified by XY1–XY4. Included within the board 10 will usually be a conductive ground or power plane which is referred to as a reference plane designated by the reference numeral 14. All of the probes are moveable in an X-Y plane to various points on the circuit board. The probes will be movable a short distance in a Z direction to enable transport thereof in the X-Y plane, and later engagement with networks under test.

Figure 2:
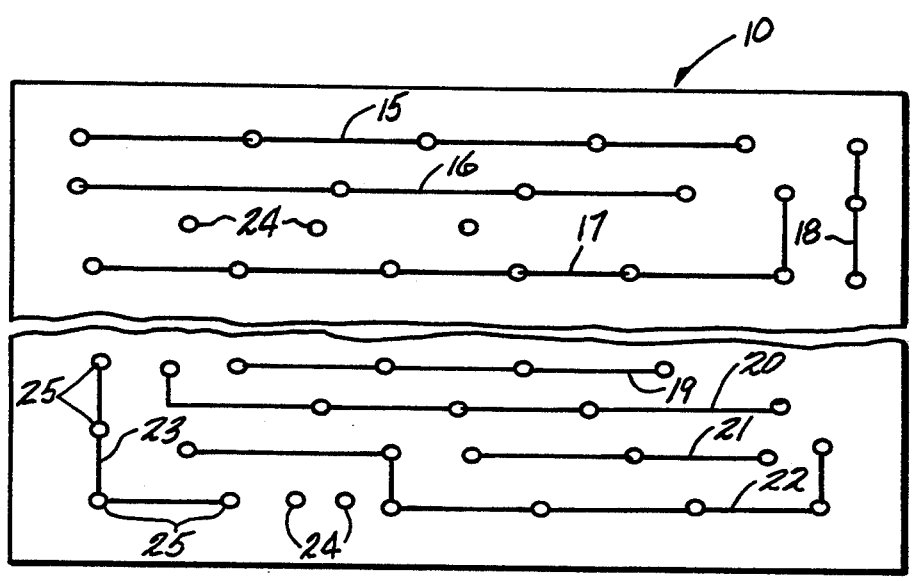
FIG. 2 is a plan view representation of a circuit board showing various networks thereon.

Reference is now made to FIG. 2 which schematically shows one side of circuit board 10 having networks 15–23 thereon and interconnections 24 through one layer for connection to a network of another layer. Each of the networks may have one or more connection points 25 (numbered only on network 23) therein to permit selective mounting of circuit components. It is the connection points of various networks 24 and 25 which are test points and may be selectively electrically engaged by the probes as will hereinafter be described.

In the present invention, two types of testing for circuit integrity may be utilized. In a first mode a network may be charged to a predetermined voltage and then the discharge of the network with respect to a reference conductive plane may be time measured to determine the integrity of that particular network. If the measured discharge time is within certain limits then the tested network is determined to be .good. If the discharge time is too long this will indicate a short circuit of one network to another. If the discharge time is shorter than a given time this will indicate that the network under test has an opening or discontinuity someplace therein.

If a short circuit is indicated or an open circuit indicated then the probes may be utilized in a resistance test mode to determine the cause of the fault by measuring the resistance between networks.

The invention provides a new and improved method and mechanism for first making discharge tests to determine the integrity of a network, and if a suspected fault appears then the resistance measurements will be made to determine either a short circuit between networks or lack of continuity in a particular network. If all of the discharge tests are within predetermined times then there is no necessity for resistance testing of the networks.

Figure 3:
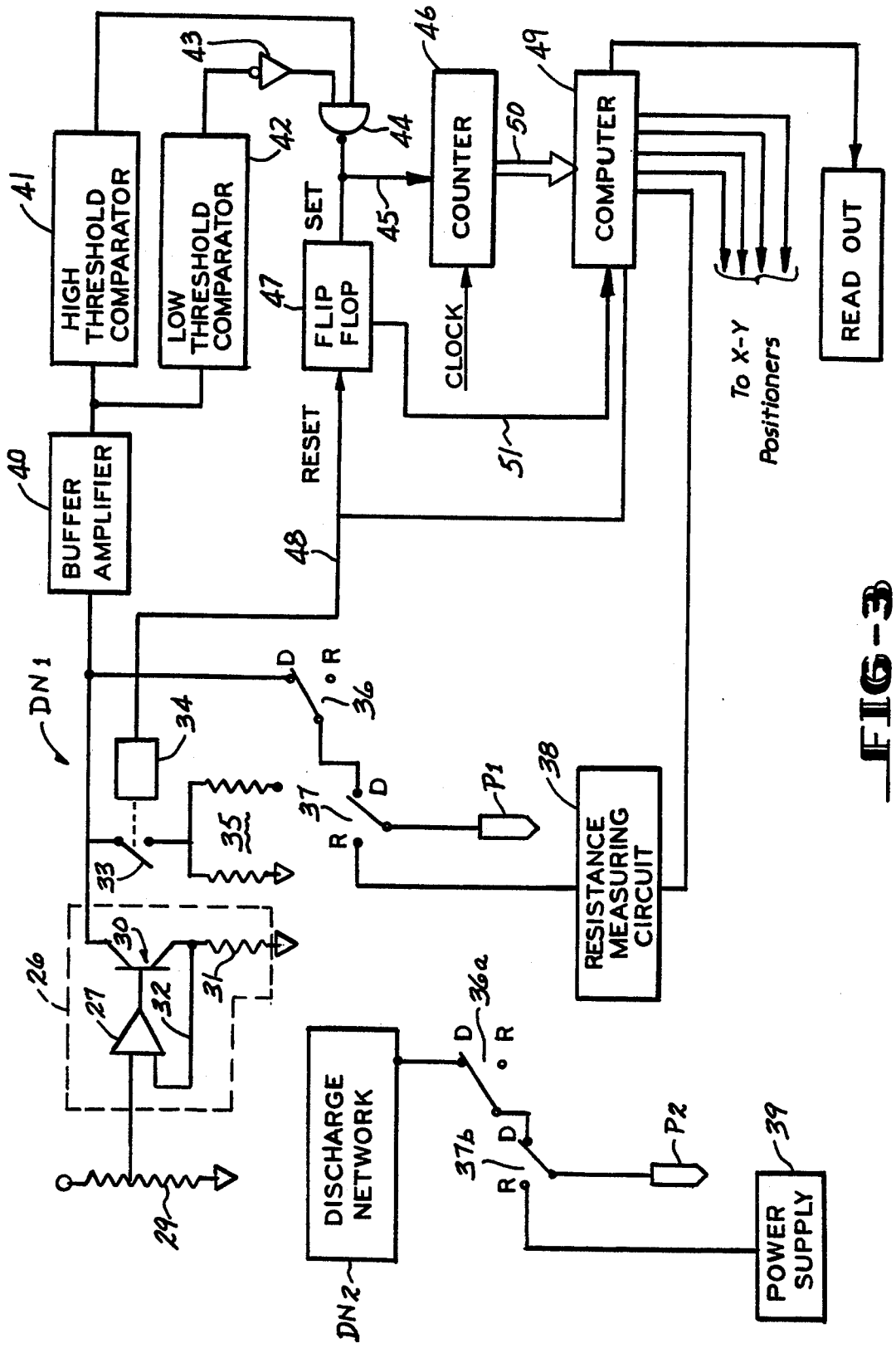
FIG. 3 is a view, partially schematic and partially in block form showing a system embodying the invention.

Reference is now made to FIG. 3 which exemplifies the circuitry associated with each of the probes P1-P4. In FIG. 3 a probe is indicated by P1 which may be placed in either what is termed a discharge mode or in a resistance mode for resistance testing.

Each of the probes are connected to a discharge circuit 26 which includes a constant current source. The constant current source includes an amplifier 27 whose input is controlled from a voltage source shown as a voltage divider 29. Amplifier 27 outputs to the base of a transistor 30 connected as an emitter follower with a high emitter resistance 31 on the order of a megohm. Amplifier 27 receives a feed back over line 32 from the top of resistance 31. Connected to the collector of transistor 30 through a switch 33 is a voltage source.

Switch 33 is shown in schematic form as under the control of a relay 34. However, switch 33 may be another transistor. In either event switch 33 is controlled as hereinafter described. Switch 33 is utilized to connect the collector of transistor 30 to a voltage source 35, or to disconnect the collector from voltage source 35 as hereinafter described.

A probe exemplified as probe P1 is also connected to the collector of transistor 30 through switches 36 and 37. Switches 36 and 37 have contacts identified by the references D and R. When the switches are on the D contacts the system is enabled for discharge testing. When the switches are on the R contacts, probe P1 is enabled for resistance testing. In such resistance testing mode probe P1 is connected to a resistance measuring circuit 38 as explained hereinafter in conjunction with FIG. 5. Also shown in FIG. 3 is probe P2 and discharge network DN2, which is identical to network DN1, and probe P2. When the switches 36a and 36b are on contacts R, probe P2 will be disconnected from network DN2 and connected to a voltage source indicated as power supply 39.

As thus far disclosed, when switch 33 is closed, probe P1 will charge to a predetermined voltage from voltage source 35. At this time, probe P1 will contact one of the networks on board 10 and charge such network to the voltage of source 35. Then switch 33 is opened. The charge on the network under test then begins to decrease substantially linearly through transistor 30, resulting in a decreasing ramp voltage.

High and low levels of this ramp voltage are detected to determine the discharge time of the charge on a network under test as hereinafter explained.

The outputs of a voltage follower 40 which is also a buffer amplifier follows the voltage of the collector of transistor 30 and supplies an output to high and low level voltage comparators or detectors 41 and 42 respectively. Low threshold comparator 42 outputs to a logic inverter 43 and to a NAND gate 44. The output of high threshold comparator 41 is also applied to NAND gate 44.

When NAND gate 44 turns on, it applies an enabling signal over a line 45 to a counter 46. Counter 46 receives high frequency clock pulses on the order of 8 megahertz. NAND gate 44 also supplies an input to a flip-flop 47 for purposes hereinafter described. It is thus far apparent that counter 46 will count the clock pulses so long as NAND gate 44 is open. The number of clock pulses counted in counter 46 is a measurement of the discharge time of the charge on a network under test. A computer 49 accesses the count of counter 46 and will supply an off/on signal over line 48 to relay 34 to control the opening and closing of switch 33. The computer records the count of clock pulses from counter 46 during a discharge test and thus records the time of discharge.

Reference is now made to FIG. 4 in conjunction with FIG. 3. FIG. 4 is a timing diagram of the operation of the probe circuit of FIG. 3. When the switches 36 and 37 are on the D contacts the system is in a discharge mode of operation.

As shown in FIG. 4 during time $t_0$ to $t_1$ switch 33 is closed and probe P1 is charged to a predetermined voltage. At time $t_1$ when probe P1 is in contact with a network, switch 33 is opened and the charge on probe P1 and the network which it contacts will begin to decrease linearly as exemplified by diagram B in FIG. 4. At time $t_2$ high threshold comparator will turn ON as exemplified in wave form E in FIG. 4 and by voltage level H in FIG. B of FIG. 4. This is the waveform at the output of comparator 41. The charge on probe P1 and its contacting network will decrease substantially linearly and at time $t_3$ low threshold comparator 42 which has been at a low state will, turn ON as shown by waveform D in FIG. 4. This will close NAND gate 44. Prior to this the output of inverter 43 has been high, as shown by waveform F. The waveform F is at inverter 43. During the times $t_2$ to $t_3$ gate 44 is enabled as shown by wave form C in FIG. 4. Thus during the time $t_2$ to $t_3$ gate 44 enables counter 46 to count the clock pulses.

Gate 44 will also set flip-flop 47 which over line 51 will apply a read signal to computer 49 which over bus lines 50 reads the content of counter 46 accumulated during times $t_2$-$t_3$.

At time $t_1$ computer 49 over line 48 opens switch 33 and the charge on the probe P1 and the network to which it is connected commences to decrease. Flip-flop 47 is reset by the computer over line 48. The computer also closes switch 33 to permit recharging of the probe P1 at time $t_4$.

It will be noted that the output of high threshold comparator 41 is normally low until time $t_2$ (FIG. 4E) when the discharge voltage reaches the threshold H shown in waveform B of FIG. 4 and then the output of inverter 43 will remain high until the trailing edge of the gating signal waveform C of FIG. 4 from NAND gate 44. When NAND gate 44 goes high as shown in waveform C of FIG. 4 at time $t_3$ the counter 45 is no longer enabled and flip-flop 47 over line 51 will so signify the computer 49 and it accepts the clock pulse count then in counter 46.

During the time $t_4$-$t_5$ as shown in waveform D, the computer 49 is reading the contents of counter 46 and during this time the probe P1 is moved by the associated X-Y positioner to the next network to be tested. During this movement of probe P1 the system commences measuring from another of probes P2-P4. While probe P1 is being moved to contact another network, it is being recharged at time $t_4$-$t_5$ which is a repetition of time $t_0$-$t_1$. The time $t_1$-$t_4$ is a cycle time which varies as a function of discharge time.

Assume that the time $t_2$-$t_3$ is longer than what may be described as a normal range. This would indicate that two networks are shorted together. Such information is recorded in memory in computer 49. If two or more networks show the same or essentially the same discharge time which is longer than expected then a resistance check is made between these networks. This test may be made immediately or may await the completion of all discharge gathering tests.

FIG. 5 represents the probes P1 and P2 when placed in a resistance testing mode. This is also representative of any two probes placed in a resistance testing mode. This would also be representative of the probes P3 and P4 on the other side of the board. In the resistance testing mode the switches 36, 37, and 36a, 37a are thrown to the R contacts and the probes are isolated from the discharge circuits and connected between power supply 39 and resistance measuring circuit 38 so that the resistance between two networks may be checked to determine if a short circuit exists.

If the discharge time on a network is too short, which is indicative of an opening in a network, two probes will be utilized in a resistance mode of testing to check points on the suspect network to determine where the open circuit exists.

The testing of suspected short circuits between networks is done on an adjacency basis. Only networks which are closely adjacent need be tested for shorts; there would be no need, for example, to test network 15 and network 22 for shorts. Referring to FIG. 2, if the discharge testing of networks 15 and 22 had similar discharge times above an established norm, there would be little basis to conclude or to make a resistance test between these two networks. However, if the discharge tests on networks 15 and 16 showed the same discharge times over a given norm, then a resistance test would be made as between these two networks.

If the discharge time of a network is below a predetermined norm, then resistance tests are made between the connection points 24 or 25 thereon to determine the location of an open circuit. To establish the time norms of discharge of each network on a particular board, a board is initially tested using design data to create X-Y data for each network and terminal points of each network which is stored in memory in computer 49. The computer 49 then controls all X-Y positioners, XY1-XY4, for probes P1-P4 for the purposes programmed into the computer.

As previously explained, the decision to test networks for shorts after discharge tests is based on a probability or adjacency basis and does not include a testing of each network against every other network.

Once discharge norms or master discharge values, as they may be termed, are established for each network on a board, what is referred to as a reference board is established. This date is stored in computer memory for comparison in discharge testing on all other common boards.

The information stored in the computer after determining a reference board is
1. Expected discharge times for all test points;
2. Identification of connection points on each network;

3. The X-Y position of all connection points of each network; and

4. The X-Y position of all test points on a board.

With this information the computer may control the X-Y positioning of all probes.

A read out device 53 such as a CRT or printer is utilized to give an operator of the system information regarding the testing of a circuit board.

It may thus be seen that the objects of the invention set forth, as well as those made apparent from the foregoing description, are efficiently attained. While preferred embodiments of the invention have been set forth for purposes of disclosure, modification to the disclosed embodiment of the invention, as well as other embodiments thereof, may occur to those skilled in the art. Accordingly, the appended claims are intended to cover all embodiments of the invention and modifications to the disclosed embodiments which do not depart from the spirit and scope of the invention.

What is claimed is:

1. A system for measuring the integrity of networks on a bare circuit board comprising at least two moveable probes for contacting networks on the circuit board, means including a voltage source for charging networks through said probes to a predetermined voltage with respect to a conductive reference, discharge circuits for discharging charges on networks contacted by said probes, high and low threshold detectors for receiving the discharge of each network from said discharge circuits, means for measuring the discharge time of a charged network with respect to the conductive reference between the thresholds of said high and low threshold detectors, and means for recording the discharge time between said high and low thresholds.

2. The system of claim 1 where each of said probes is charged to a predetermined voltage and to contact one of said networks.

3. The system of claim 1 where said means for charging comprises a voltage source connectable to each of said probes, said networks being charged to a predetermined voltage through contact with one of said probes, said discharge circuit is a constant current discharge circuit and means for disconnecting said voltage source from said probes.

4. The system of claim 3 where said means for measuring comprises gating means connected to the outputs of said detectors for providing an output pulse of a time width indicative of a discharge time of a network, a counter, a clock providing output pulses, the output of said gating means enabling said counter to count pulses from said clock during the duration of the output pulse from said gating means, said count of clock pulses in said counter being indicative of the time of discharge of the network under test.

5. The system of claim 1 further including a resistance measurement circuit, a power source, switching means for disconnecting said probes from a discharge circuit and connecting one of said probes to said power source and the other of said probes to said resistance measurement circuit.

6. The system of claim 1 where said discharge circuits comprise a constant current source and said probes discharge through a constant current source.

7. The system of claim 6 further including a voltage follower connected to each of said probes for providing a voltage signal representative of the discharge of the charge on a network contacted by a probe, said voltage followers supplying a voltage signal to said high and low threshold dectors.

8. The system of claim 1 wherein a voltage source is connectable though a switch to a discharge circuit, and said switch is opened when a probe contacts a network to permit discharge of said network through a discharge circuit.

9. The system of claim 8 where a network is charged through one of said probes prior to opening of said switch.

10. A method of testing the integrity of networks on a circuit board which comprises the steps of
   a. providing at least a pair of electrically conductive probes with means for moving each of said probes in an X-Y plane.
   b. each of said probes being connectable to a discharge circuit
   c. moving each of said probes selectively into contact with a circuit board network and charging the contacted network to a predetermined voltage with respect to a conductive reference plane, and
   d. measuring the time of voltage discharge of the charged network.

11. The method of claim 10 further including the steps of switching the probes from said discharge circuits, one to a power source and the other to a resistance measuring circuit and contacting the ends of a network or portions thereof to determine the resistance of a contacted network between said probes.

12. A system for testing networks on a circuit board for integrity where the circuit board has networks on at least one side thereof comprising a fixture for holding said circuit board, a pair of probes, each of said probes being movable in an X-Y plane to contact networks, a voltage source, means in said circuit board or external thereto providing a conductive reference plane with respect to said networks, means for charging said probes to a predetermined voltage from said voltage source, a discharge circuit connected to each of said probes whereby the charge on a probe and any network in contact with a probe discharges through said discharge circuit when said means for charging is disconnected from a probe, means for measuring the discharge time of a contacted network, a resistance measuring circuit, a power source, and switching means for disconnecting said probes from respective discharge circuits and connecting one of said probes to said power source and the other probe to said resistance measurement circuit whereby said probes contact networks or portions of a network on said board to make resistance measurements thereon.

13. The system of claim 10 where the circuit board has networks on a second side thereof, a second pair of probes on the second side, each movable in an X-Y plane to contact networks on the second side of said board.

14. The system of claim 12 where said networks are charged to a predetermined voltage through contact with one of said probes, and means for disconnecting said voltage source from said probe and then measuring the discharge time of a network through said probe and said constant discharge circuit.

15. The system of claim 14 including high and low threshold detectors for receiving the discharge of a network, said means for measuring comprises gating means connected to the outputs of said detectors for providing an output pulse of a time width indicative of a discharge time of a network, a counter, a clock providing pulses, the output of said gating means enabling said counter to count pulses from said clock during the duration of the output pulse from said gating means, said count of clock pulses in said counter being indicative of the time of discharge of the network under test.

16. The system of claim 12 where said discharge circuit comprises a constant current source and each of said probe discharges through said constant current source.

17. The system of claim 16 further including a voltage follower connected to each of said probes for providing a voltage signal representative of the discharge of the charge on a network contacted by a probe.

18. The system of claim 17 further including high and low voltage threshold comparators for receiving the discharge of a network, said means for measuring comprises gating means connected to the outputs of said comparators for providing an output pulse of a time width indicative of a discharge time of a network, a counter, a clock providing output pulses, the output of said gating means enabling said counter to count pulses from said clock during the duration of the output pulse from said gating means, said count of clock pulses in said counter being indicative of the time of discharge of the network under test.

19. The system of claim 12 wherein said voltage source is connectable through a switch to said discharge circuit, and said switch is opened when a probe contacts a network to permit discharge of said network through said discharge circuit.

20. The system of claim 19 where a network is charged through one of said probes prior to opening of said switch.

* * * * *